(12) United States Patent
Suda

(10) Patent No.: US 6,232,881 B1
(45) Date of Patent: *May 15, 2001

(54) HAND HELD ELECTROMAGNETIC FIELD DETECTOR

(76) Inventor: Yoshimitu Suda, 1-6-6 Chitose, Sumida-ku, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/542,083

(22) Filed: Apr. 3, 2000

Related U.S. Application Data

(62) Division of application No. 09/073,176, filed on May 5, 1998, now Pat. No. 6,064,190.

(51) Int. Cl.[7] .................................................. G08B 17/12
(52) U.S. Cl. ............................ 340/600; 324/95; 324/149
(58) Field of Search .................................. 340/600, 552; 324/95, 149

(56) References Cited

U.S. PATENT DOCUMENTS

| 4,424,483 | * | 1/1984 | Aslan | 324/95 |
| 4,431,965 | * | 2/1984 | Aslan | 324/95 |
| 4,692,685 | * | 9/1987 | Blaze | 324/692 |
| 6,064,190 | * | 5/2000 | Suda | 324/438 |

* cited by examiner

Primary Examiner—Edward Lefkowitz
(74) Attorney, Agent, or Firm—Jordan and Hamburg LLP

(57) ABSTRACT

A hand held detection device for detecting electromagnetic waves at at least one predetermined frequency has an elongated conductor member having a bottom end portion for grasping by a hand of a user and a top end portion, the elongated conductor is configured to function as an antenna at the predetermined frequency. An inductor is supported on and electrically connected to the top end portion of the elongated conductor. A wave detection circuit is supported at the top end portion of the elongated conductor member one the inductor. The wave detection circuit includes a rectifier diode for rectifying high-frequency alternating current received in the inductor via the elongated conductor to produce a direct current. The wave detection circuit also includes an indicating means for indicating a presence of a direct current produced by the rectifier diode, the indicating means and the rectifier diode are serially connected to form a series circuit, and the series circuit is connected across a portion the inductor. Optionally, an LC-resonance circuit may be substituted for the coil.

20 Claims, 21 Drawing Sheets

HAND HELD ELECTROMAGNETIC FIELD DETECTOR

This application is a Division of Ser. No. 09/073,176 filed May 5, 1998, U.S. Pat. No. 6,064,190.

BACKGROUND OF THE INVENTION

The present invention relates to a device for detecting electromagnetic waves capable of the detecting it that is used for a portable telephone or which dose harm to human body.

Conventional indicator for a portable telephone, as a detector which is able to inform a user visually when the portable telephone comes to the calling-up and message received conditions or a calling condition, is composed of first and second rectifier diodes connected to a top end of the portable telephone with alternating ends thereof as to the opposite direction; first and second conductive pins connected to the other ends of the rectifier diodes with each of other ends thereof; and a luminous element connected between the first and second conductive pins.

The conventional indicator for portable telephone includes two rectifier diodes such that its structure is complex, and it costs too much. In addition, it is possible to use as the indicator only when the indicator is provided to the top end of the antenna of the portable telephone.

SUMMARY OF THE INVENTION

In view of the foregoing, it is an object of this invention to provide a device for detecting electromagnetic waves that the structure is simple, and electromagnetic waves is detected easily so that it is possible to find the sending place of electromagnetic waves. It is another object of this invention to provide a device for detecting electromagnetic waves that is attached to the antenna attachment housing of the portable telephone and allows to inform visually a user that the portable telephone comes to the calling-up and massage received conditions.

The above and further objects and novel features of the invention will more fully appear from the following detailed description when the same is read in connection with the accompanying drawings. It is to be expressly understood, however, that the drawing is for the purpose of illustration only and is not intended as a definition of the limites of the invention.

DESCRIPTION OF THE PREFERRED EMBODIMENT

Preferred embodiment of the present invention are described in more details below referring to the accompanying drawings.

Figure 1:
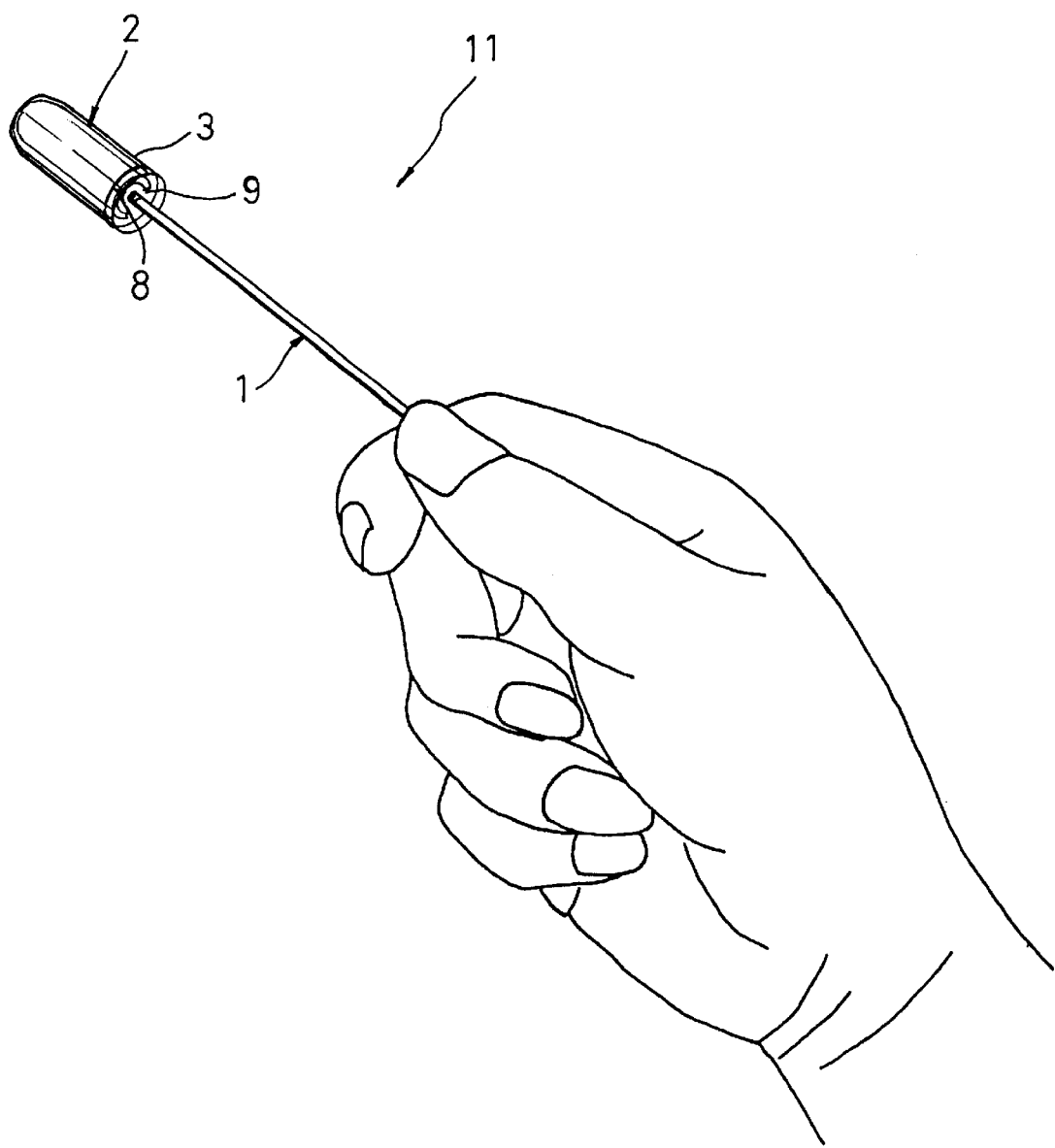
FIG. 1 is an explanation view in use showing a first embodiment of the present invention.
Figure 2:
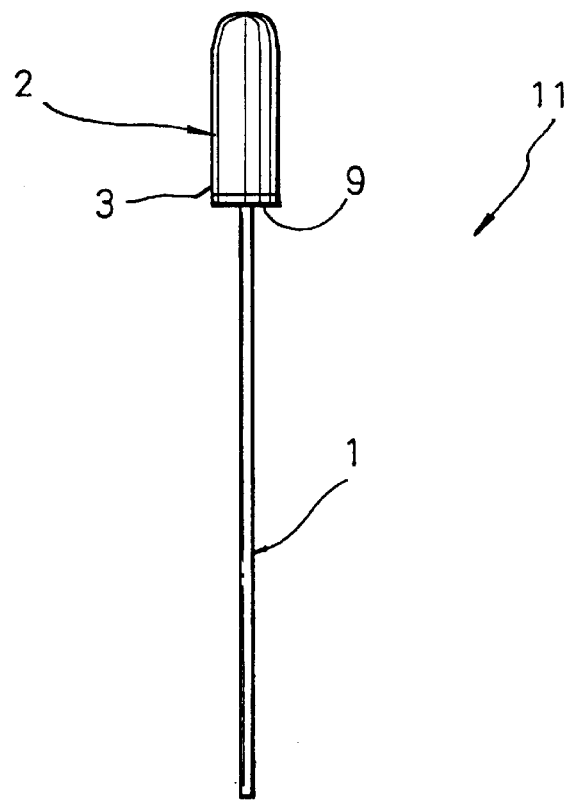
FIG. 2 is a front view showing a first embodiment of the present invention.
Figure 3:
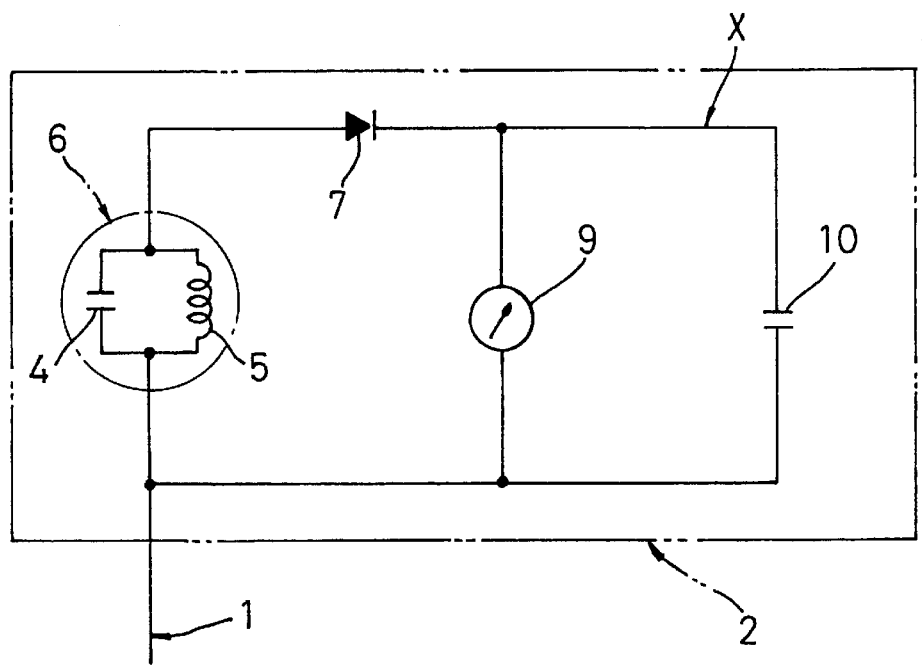
FIG. 3 is a schematic circuit diagram showing a first embodiment of the present invention.

FIGS. 1 to 3 illustrate a device for detecting electromagnetic waves 11 of a first embodiment of the present invention wherein the numeral 1 is a conductor formed in the shape of a rod and able to be held at a back end portion thereof by hand, and the conductor 1 is used to same materials as antenna used before. The numeral 2 is an indicator of electromagnetic waves provided to a top end portion of the conductor 1 and further comprises a case body 3 fixedly provided to the top end portion of the conductor 1; a LC-resonance circuit 6 set up as to connect with the conductor into the case body 3 including a capacitor 4 and a coil 5, arranged parallel into the circuit 6 in order to tune the desirable frequency; a detecting circuit of electromagnetic waves X further includes a rectifier diode 7, a DC (direct current) indicator 9 as indicating device, and a smoothing capacitor 10.

The rectifier diode 7 is installed within the case body 3, both ends thereof are connected to both ends of the resonance circuit 6, and the rectifier diode 7 can convert a high frequency alternating current which generates by the resonance circuit 6 to direct current.

The DC indicator 9 is connected in series to the rectifier diode 7, and has an indicator section 8 which is provided within the case body 3 as to be able to check the meter movement from outside and can moves corresponding to the strength of a DC electric current flows from the rectifier diode 7.

The smoothing condensor 10 is installed within the case body 3 and connected in parallel to the indicator 9 as required.

In the above-mentioned device for detecting electromagnetic waves 11, when an user has the back end portion of the conductor 1 and points the top end portion of the device 11 at the direction which is seemed to be a sending place for electromagnetic waves, the excitation potential is converted a direct current by the rectifire diode 7 and flows to the indicator 9 as indicating device, so that the excitation potential generates at the both ends of the coil 5 of the resonance circuit 6 in proportion to the strength of electromagnetic waves at the sending place, in order that there is the sending place of electric wave in that direction.

As a result, the user can detect electromagnetic waves and find the sending place because the indicator section 8 moves visually by the strength of a DC electric current which is flown from the rectifier diode 7.

Then, the movement range of the indicator section 8 of the DC indicator 9 as indicating device changes to a slow-moving in order that the smoothing capacitor 10 is installed thereinto. Therefore, the user can confirm the detecting electromagnetic waves easily.

Furthermore, it is easy to convert the frequency of wave detects by the changing the capacity of the capacitor 4 within the resonance circuit 6.

DIFFERENT PREFERRED EMBODIMENTS OF THE INVENTION

Other embodiments of the present invention will now be described referring to FIGS. 4 to 38. Through the drawings of the embodiments, like components are denoted by like numerals as of the first embodiment and will not be explained.

Figure 4:
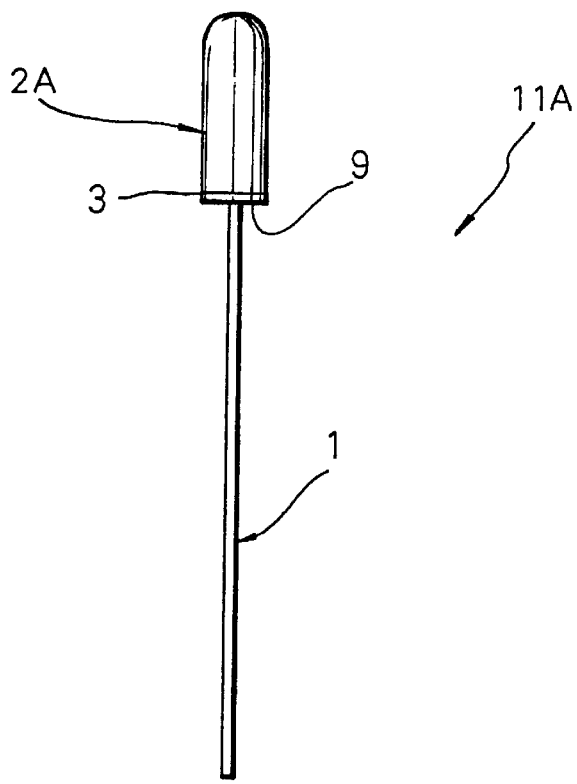
FIG. 4 is a front view showing a second embodiment of the present invention.
Figure 5:
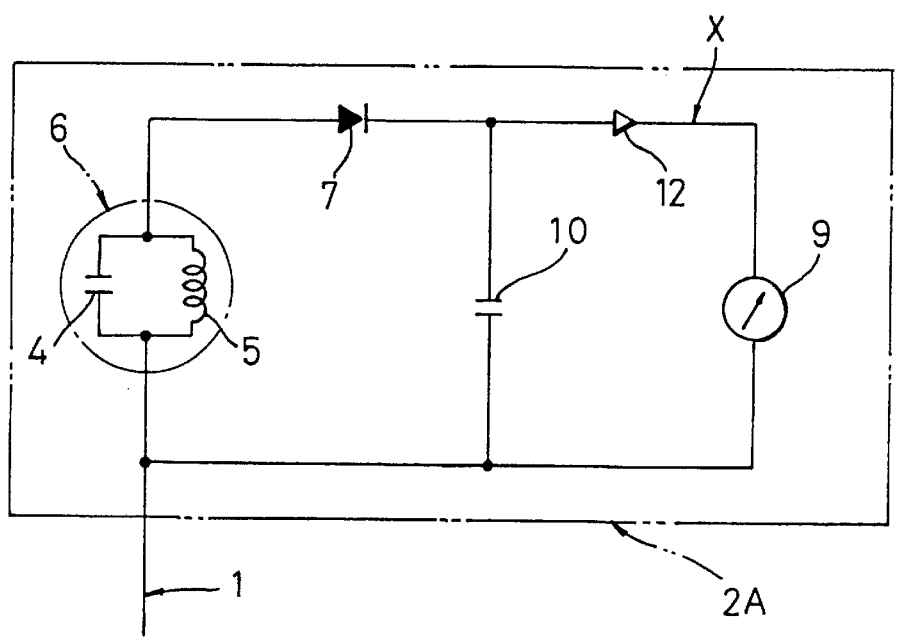
FIG. 5 is a schematic circuit diagram showing a second embodiment of the present invention.

FIGS. 4 and 5 illustrate a second embodiment of the present invention which is distinguished from the first embodiment by the fact that an amplifier 12 is interposed between the rectifier diode 7 and the DC indicator 9 into the detecting circuit X and further composed of a wide-use transistor, field effect transistor (FET), and integrated circuit (IC). A device for detecting electromagnetic waves 11A having a detector 2A with the amplifier 12 according to the second embodiment can be improved greatly a sensitivity.

Figure 6:
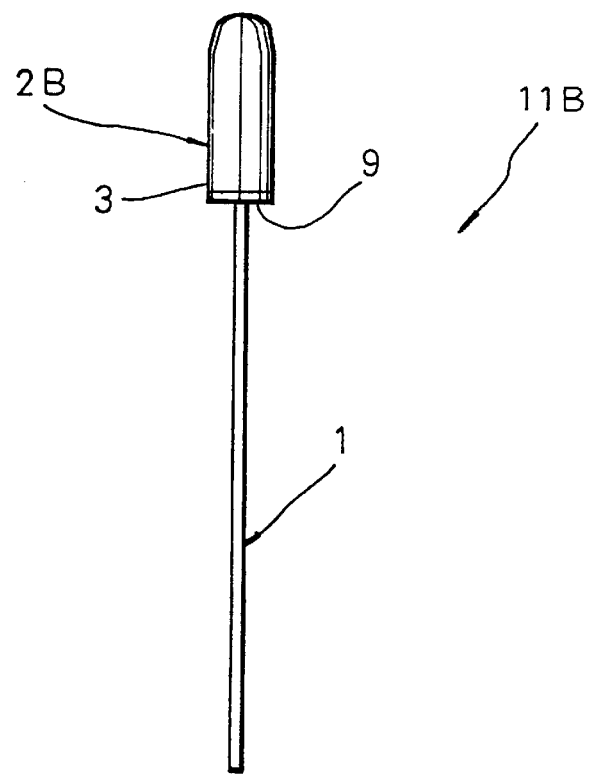
FIG. 6 is a front view showing a third embodiment of the present invention.
Figure 7:
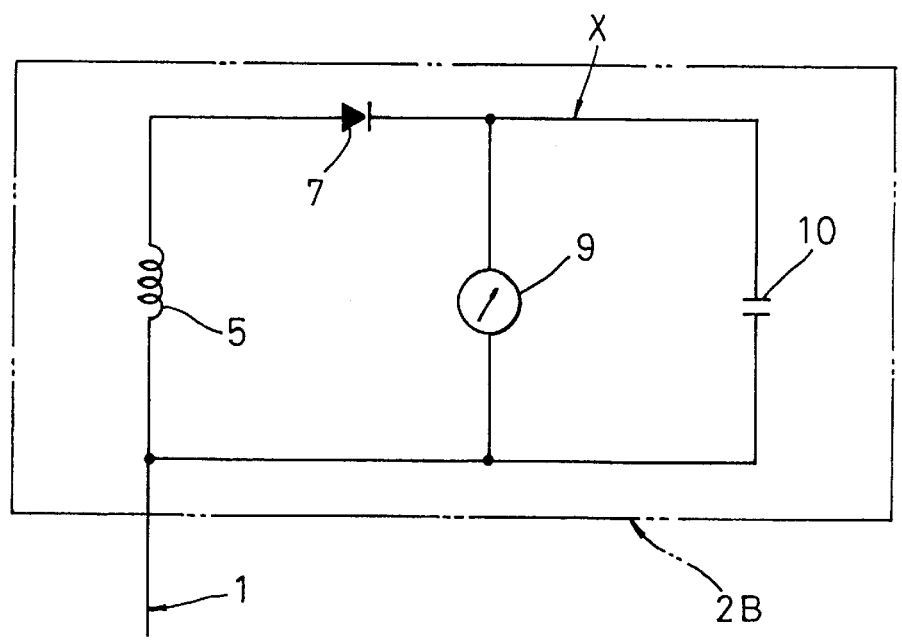
FIG. 7 is a schematic circuit diagram showing a third embodiment of the present invention.

FIGS. 6 and 7 illustrate a third embodiment of the present invention which is distinguished from the first embodiment by the fact that a detector 2B has a coil 5, instead of the LC-resonance circuit, which is able to be made a potential difference bring about therethrough. A device for detecting electroamagnetic waves 11B is formed in this way according to the third embodiment and provides the same effects as the first embodiment.

Figure 8:
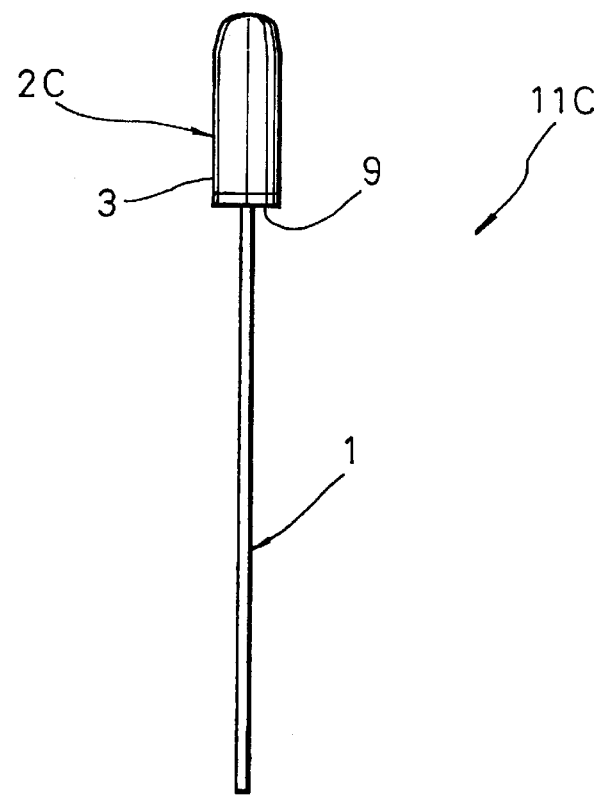
FIG. 8 is a front view showing a fourth embodiment of the present invention.
Figure 9:
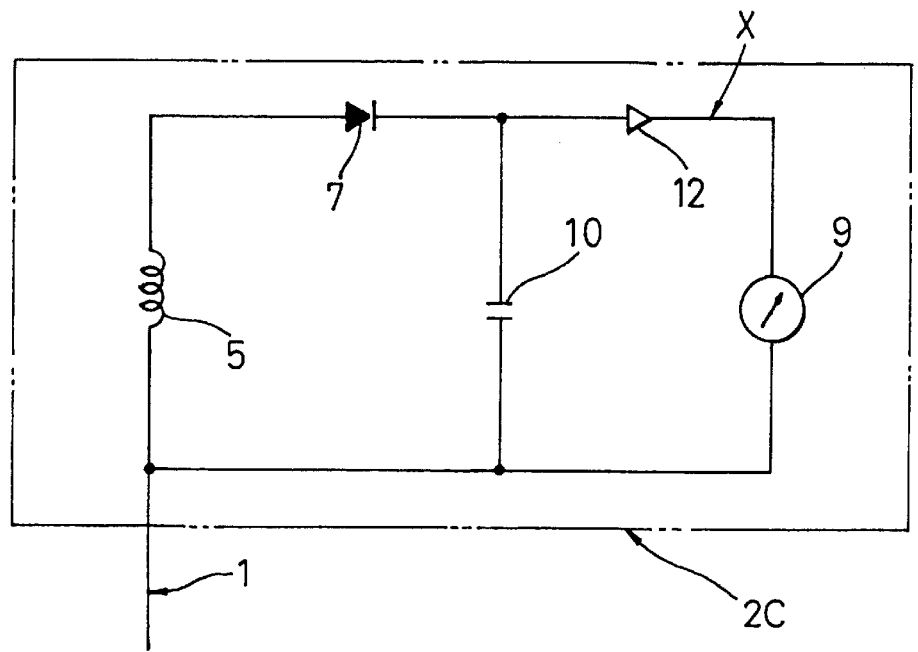
FIG. 9 is a schematic circuit diagram showing a fourth embodiment of the present invention.

FIGS. 8 and 9 illustrate a fourth embodiment of the present invention which is distinguished from the second embodiment by the fact that a detector 2B has a coil 5, instead of the LC-resonance circuit, which is able to be made a potential difference bring about therethrough. A device for detecting electromagnetic waves 11C is formed in this way according to the fourth embodiment and provides the same effects as the second embodiment.

Figure 10:
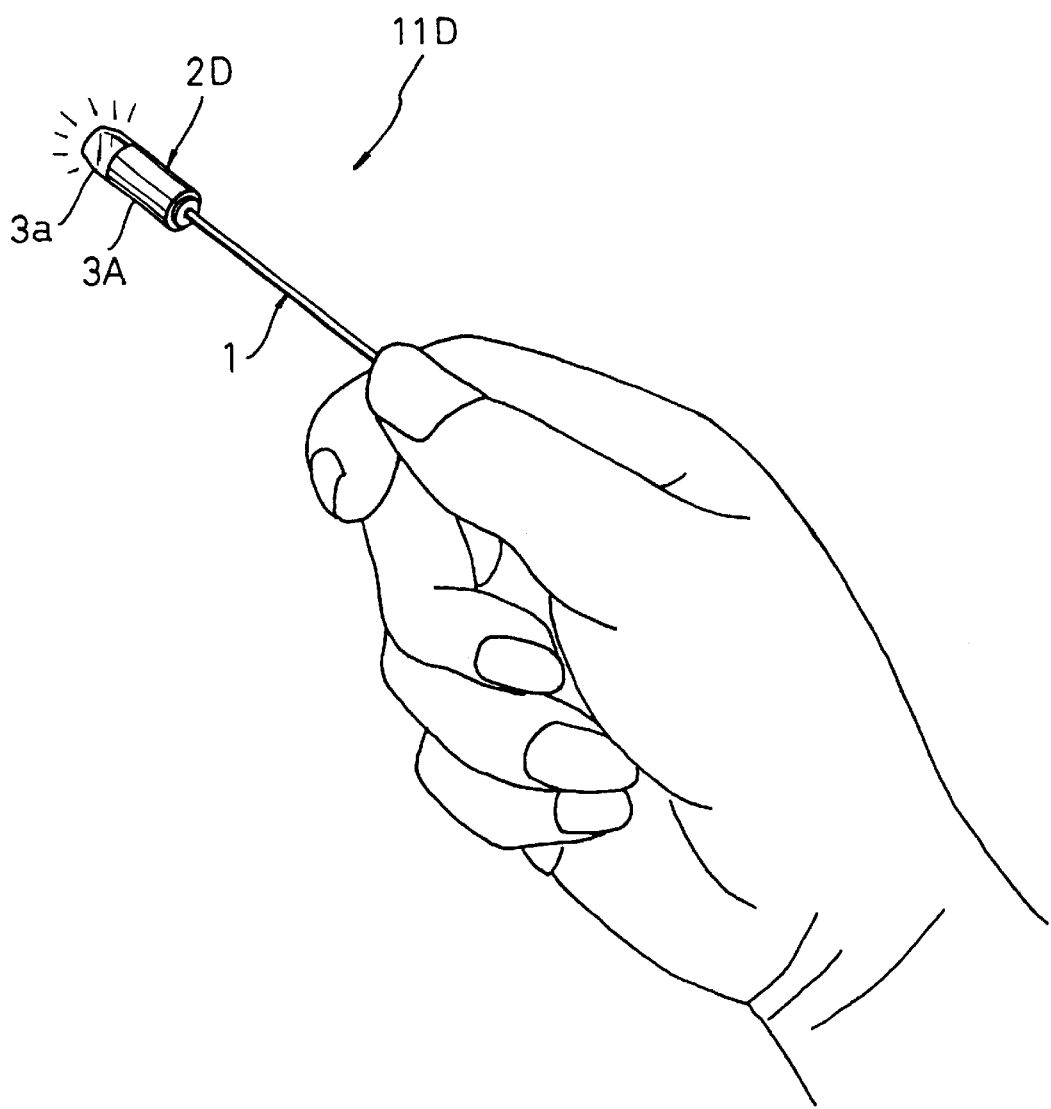
FIG. 10 is an explanation view in use showing a fifth embodiment of the present invention.
Figure 11:
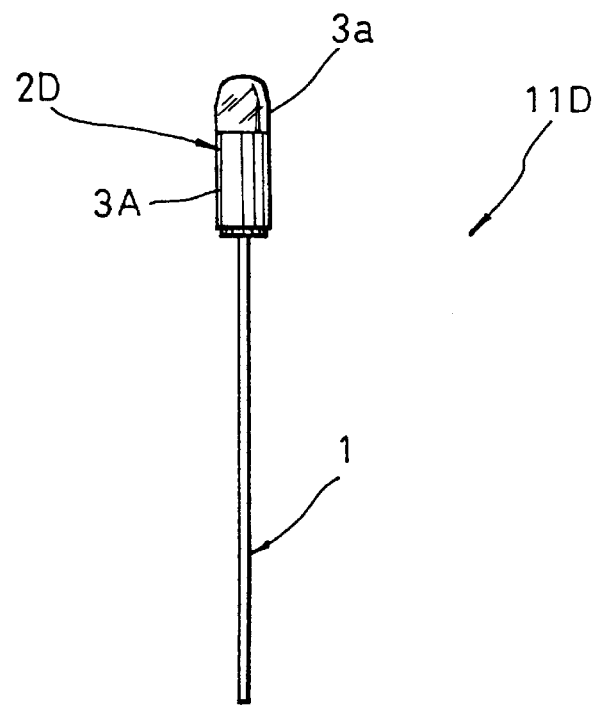
FIG. 11 is a front view showing a fifth embodiment of the present invention.
Figure 12:
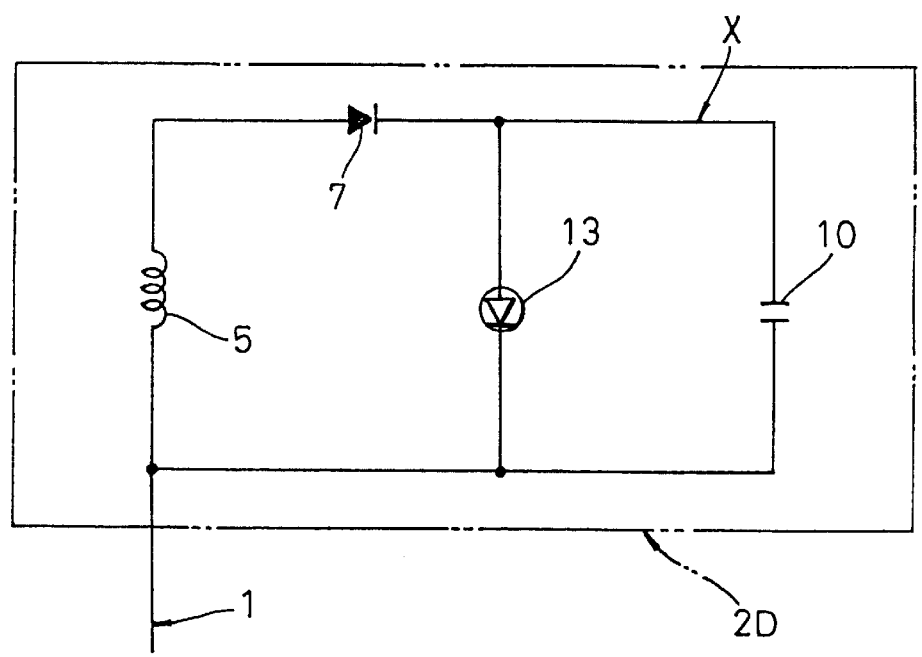
FIG. 12 is a schematic circuit diagram showing a fifth embodiment of the present invention.

FIGS. 10 to 12 illustrate a fifth embodiment of the present invention which is distinguished from the third embodiment by the fact that a detector 2D has a light emitting diode 13 instead of the DC indicator of the detecting circuit X of electromagnetic waves. In the above mentioned device for detecting electromagnetic waves 1D, the coil 5 has higher level potential in full at the both ends thereof, the wave detecting can be done efficiently such that a user can recognize the lighting of the light emitting diode 13 through a transparent body 3a of the upper part of the case body 3A, into the strong magnetic field as taking large amounts of current over the spent current of the light emitting diode 13.

Figure 13:
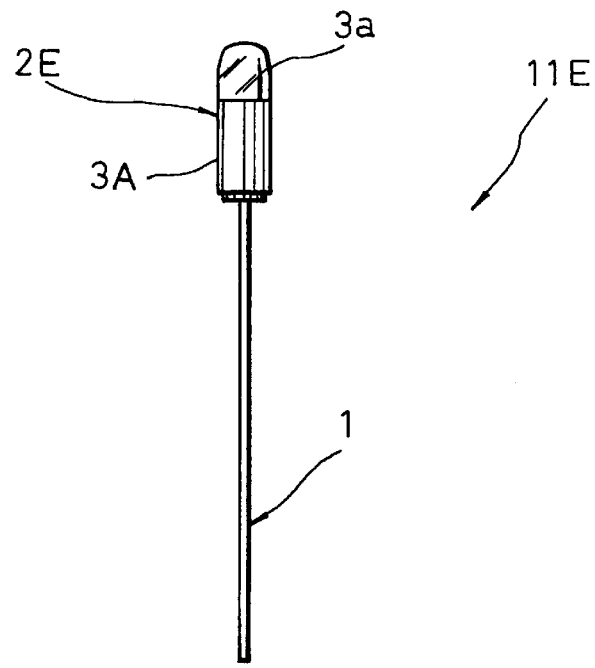
FIG. 13 is a front view showing a sixth embodiment of the present invention.
Figure 14:
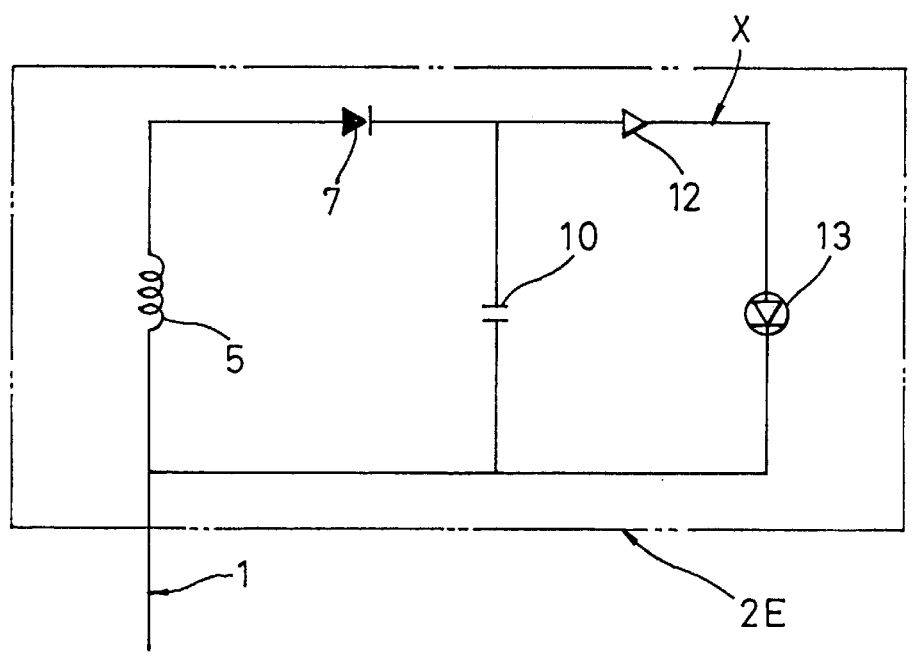
FIG. 14 is a schematic circuit diagram showing a sixth embodiment of the present invention.

FIGS. 13 and 14 illustrate a sixth embodiment of the present invention which is distinguished from the fourth embodiment by the fact that a detector 2E has a light emitting diode 13, as an inducting device, of the detecting circuit X of electromagnetic waves. In the above mentioned device for detecting electromagnetic wave 11E, the wave detecting can be done efficiently, so that the light emitting diode 13 is lighted directly, into strong magnetic field as taking large amounts of current over the spent current of the light emitting diode 13.

Figure 15:
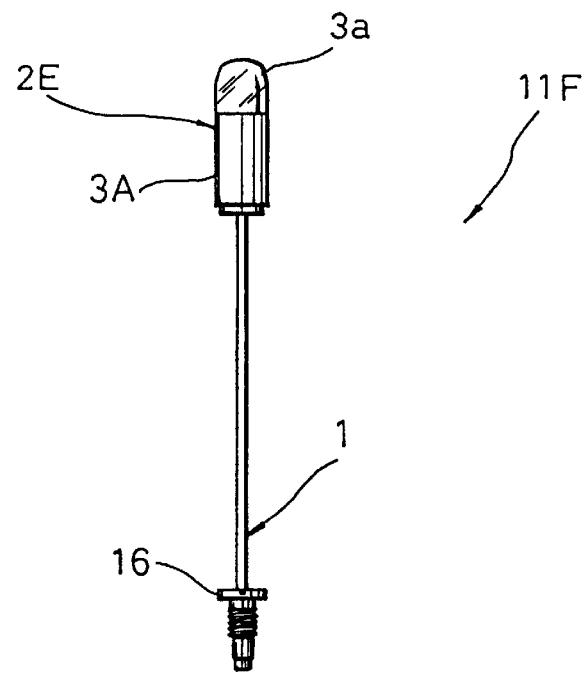
FIG. 15 is a front view showing a seventh embodiment of the present invention.
Figure 16:
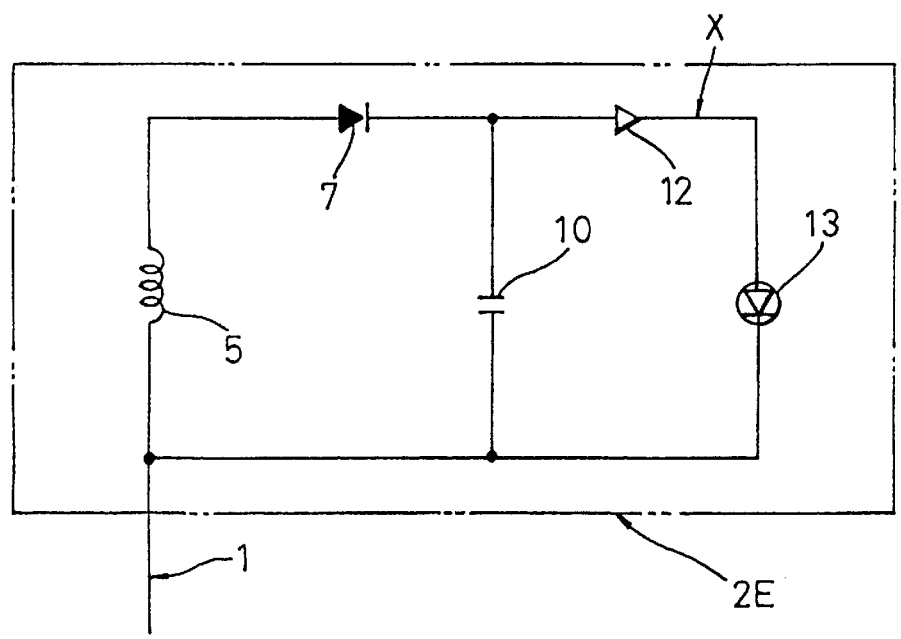
FIG. 16 is a schematic circuit diagram showing a seventh embodiment of the present invention.

FIGS. 15 and 16 illustrate a seventh embodiment of the present invention which is distinguished from the sixth embodiment by the fact that an attachment 16 is provided at a back end thereof and can be mounted to an antenna attachment 15 with a portable telephone 14. A device for detecting electromagnetic waves 11E can be used as the antenna of the portable telephone 14.

Figure 17:
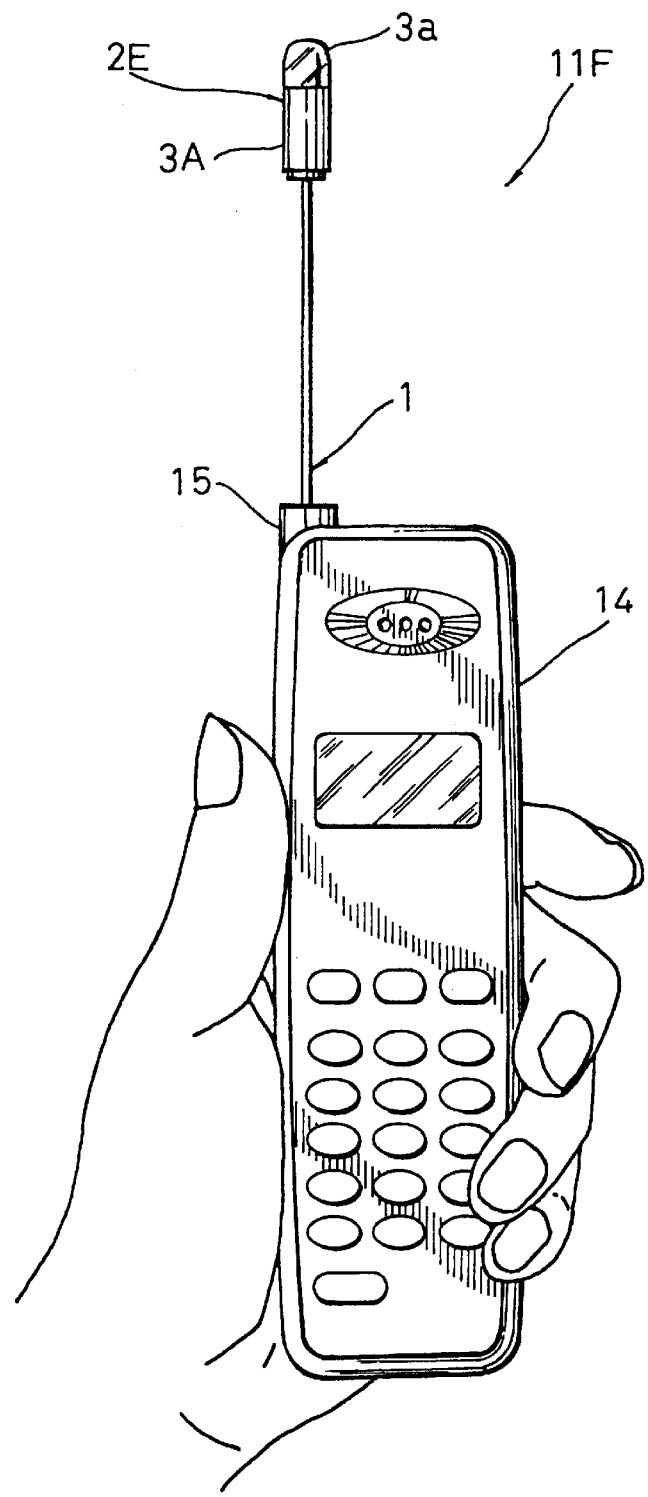
FIG. 17 is an explanation view in use showing a seventh embodiment of the present invention.
Figure 18:
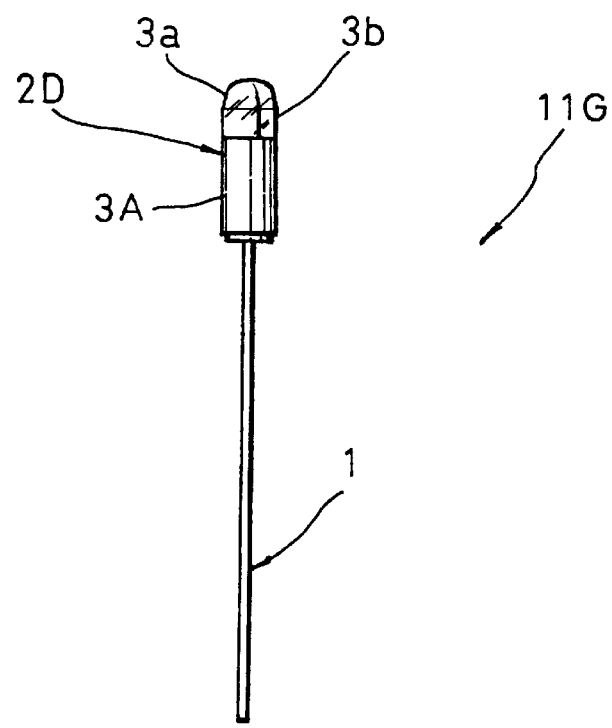
FIG. 18 is a front view showing an eighth embodiment of the present invention.
Figure 19:
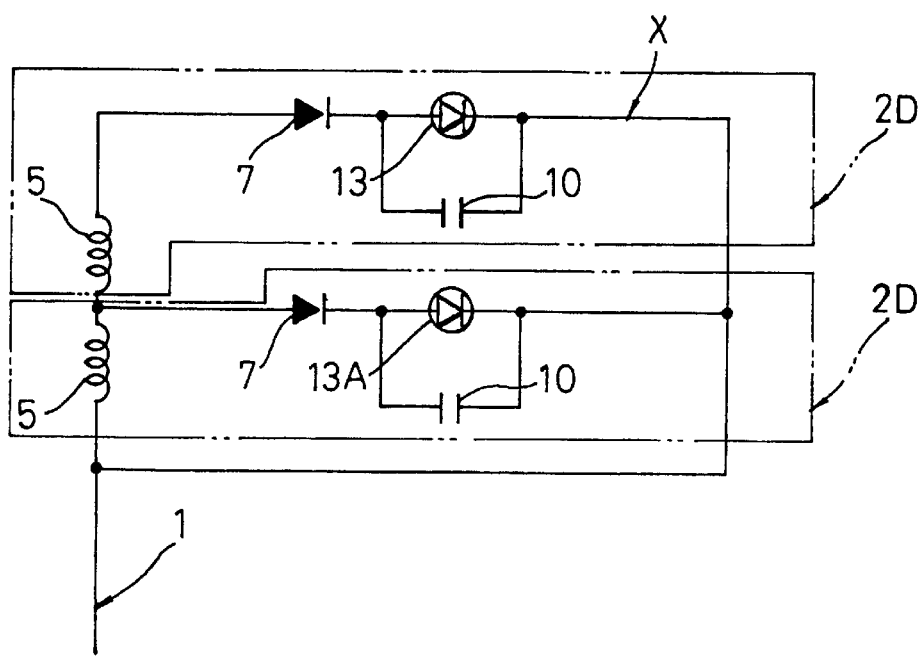
FIG. 19 is a schematic circuit diagram showing an eighth embodiment of the present invention.

FIGS. 17 to 19 illustrate an eighth embodiment of the present invention which is distinguished from the fifth embodiment by the fact that the wave detecting circuit X includes two wave detectors 2D, 2D connected in series as to be able to light one of light emitting diodes 13, 13A or both of them corresponding to the strength of waves in the strong magnetic field. A device for detecting electromagnetic waves 11G formed in this way according to the eighth embodiment can be easily detected waves and confirm of the strength of waves, so that the light emitting diodes 13, 13A can be lighted at transparent bodies 3a, 3b of upper and lower parts of the case body 3A, corresponding to the strength in the strong magnetic field.

In addition, in this embodiment of the present invention, it is possible to change luminous colors by the strength of magnetic field, such that a two colored light emitting diode can be used as the light emitting diode.

Figure 20:
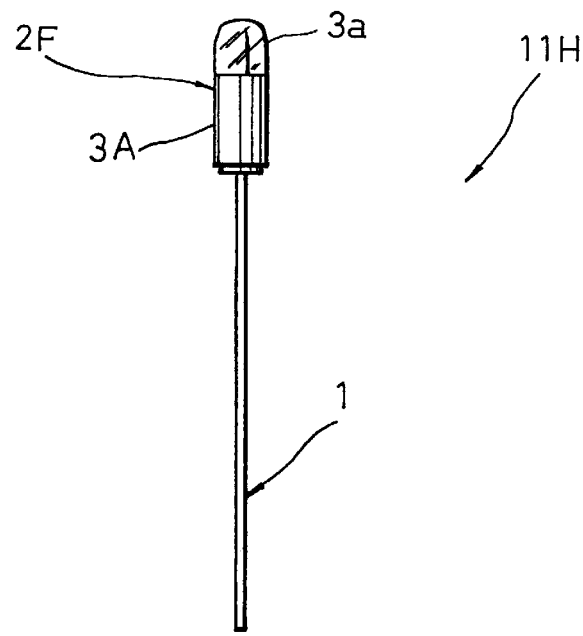
FIG. 20 is a front view showing a ninth embodiment of the present invention.
Figure 21:
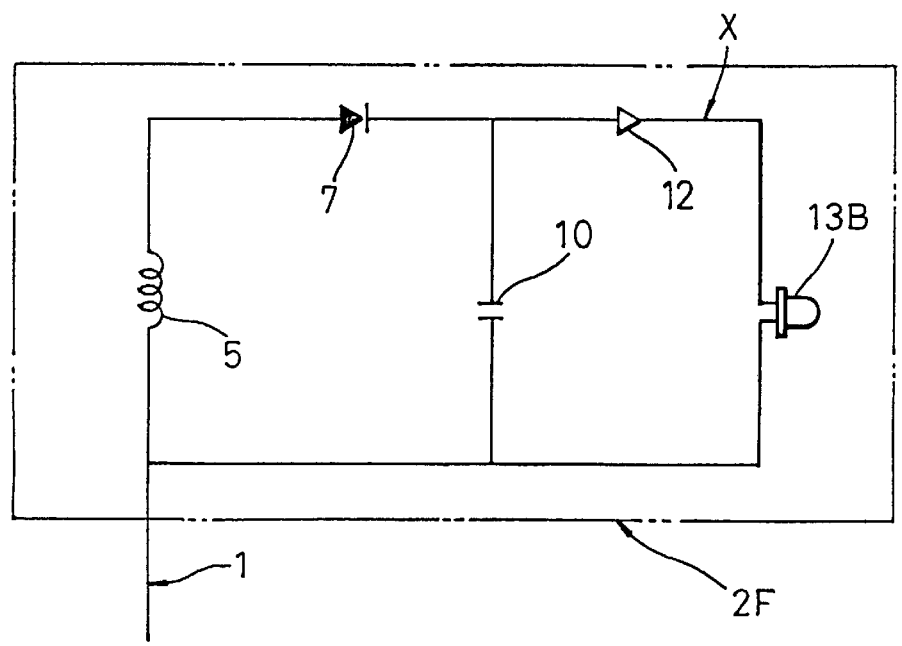
FIG. 21 is a schematic circuit diagram showing a ninth embodiment of the present invention.

FIGS. 20 and 21 illustrate a ninth embodiment of the present invention which is distinguished from the sixth embodiment by the fact that a wave detector 2F includes an automatic flashing type light emitting diode 13B as the indicating device, which is on the market, into the wave detecting circuit X. A device for detecting electromagnetic waves 11H formed in this way according to the ninth embodiment can be improved a cognitive power visually in comparison with the use of ordinary diode.

Figure 22:
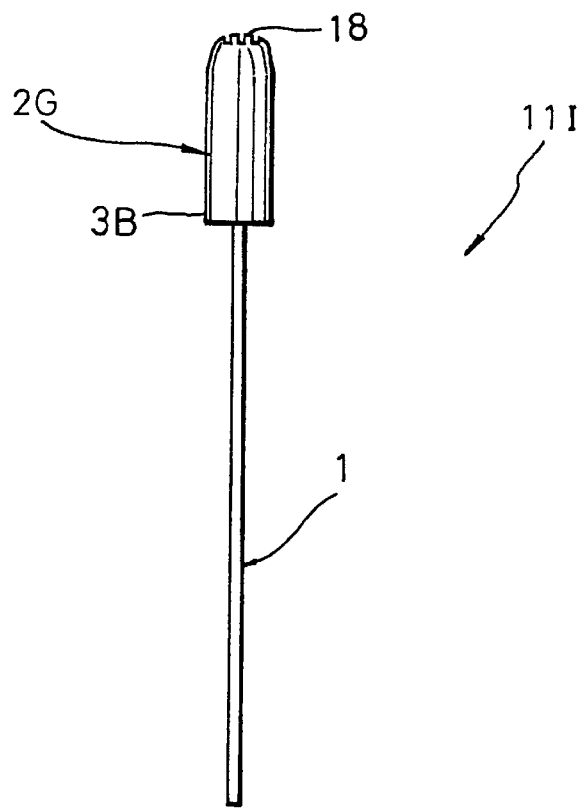
FIG. 22 is a front view showing a tenth embodiment of the present invention.
Figure 23:
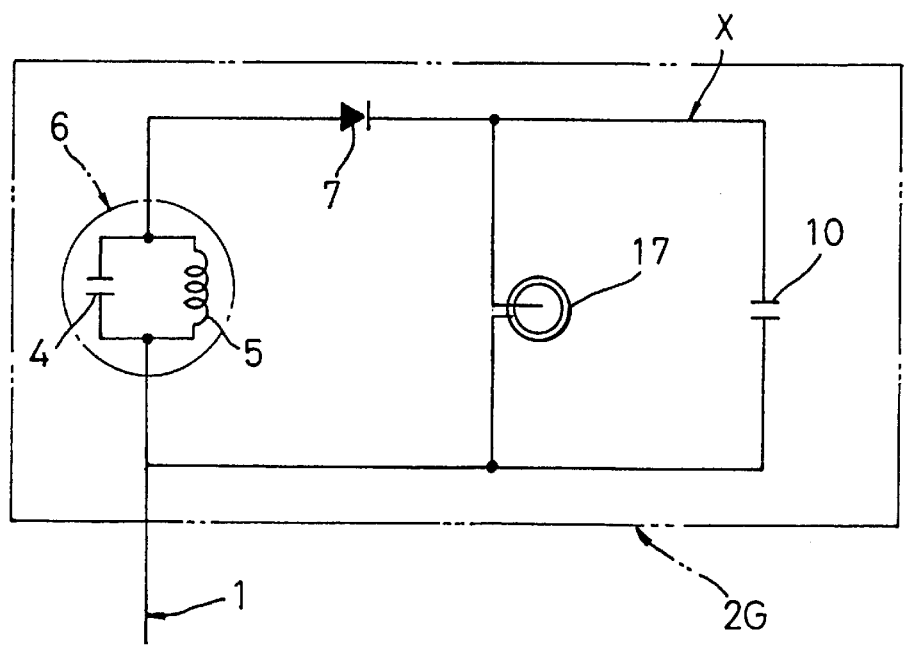
FIG. 23 is a schematic circuit diagram showing a tenth embodiment of the present invention.
Figure 24:
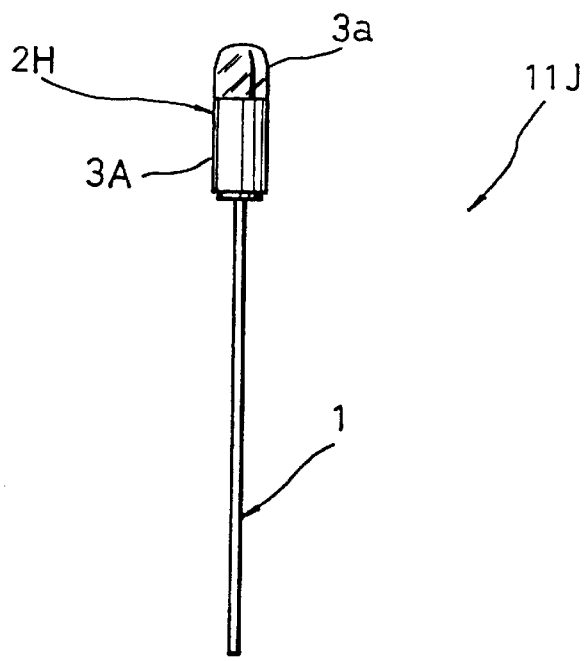
FIG. 24 is a front view showing an eleventh embodiment of the present invention.
Figure 25:
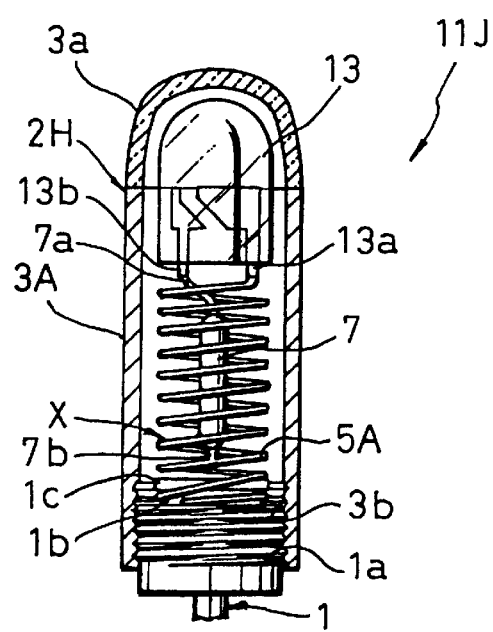
FIG. 25 is an expanded sectional view showing an eleventh embodiment of the present invention.
Figure 26:
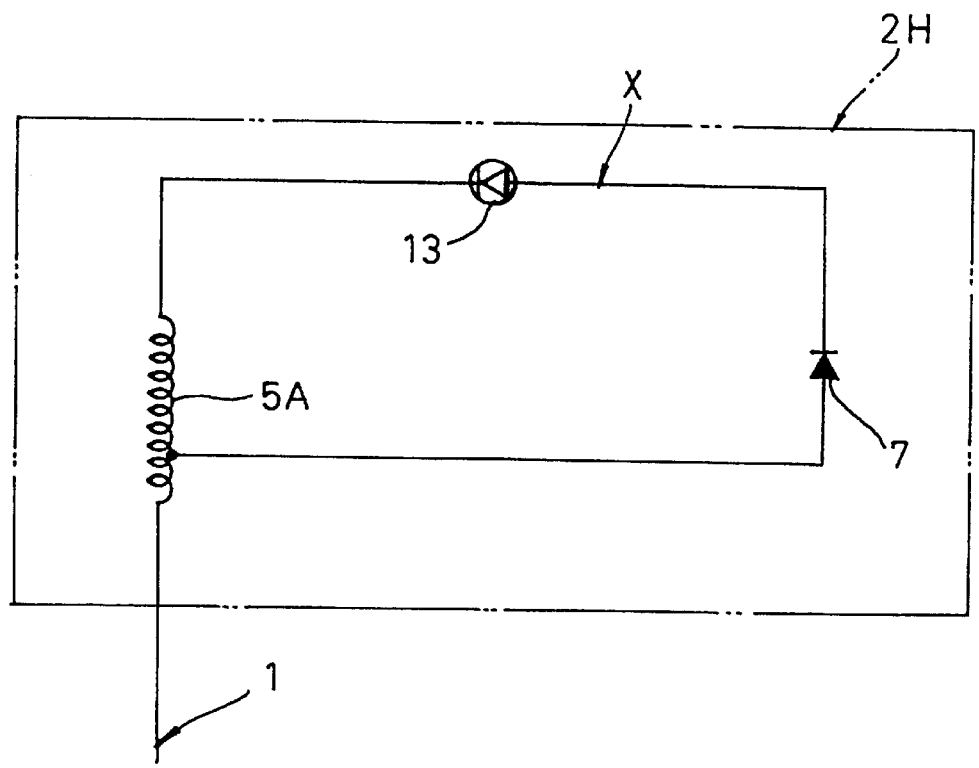
FIG. 26 is a schematic circuit diagram showing an eleventh embodiment of the present invention.
Figure 27:
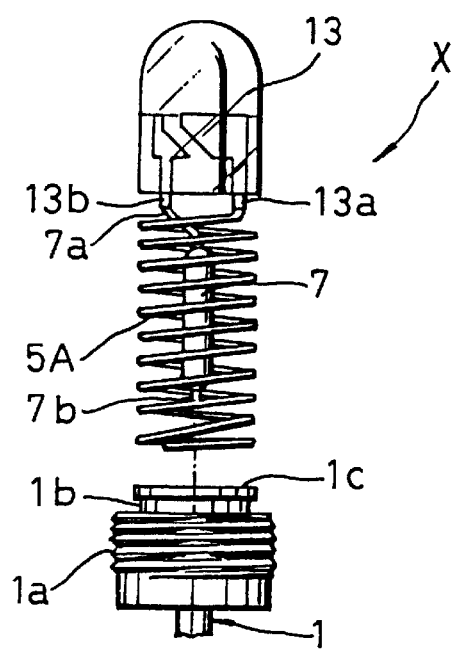
FIG. 27 is a mainly exploded view showing an eleventh embodiment of the present invention.
Figure 28:
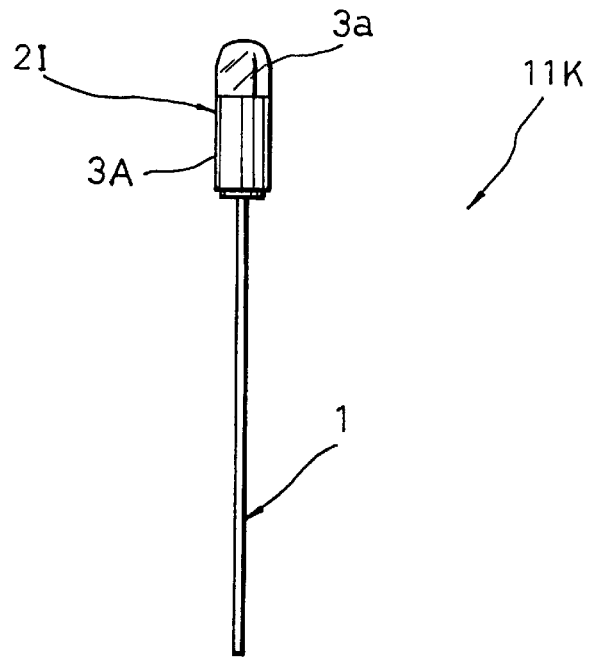
FIG. 28 is a front view showing a twelfth embodiment of the present invention.
Figure 29:
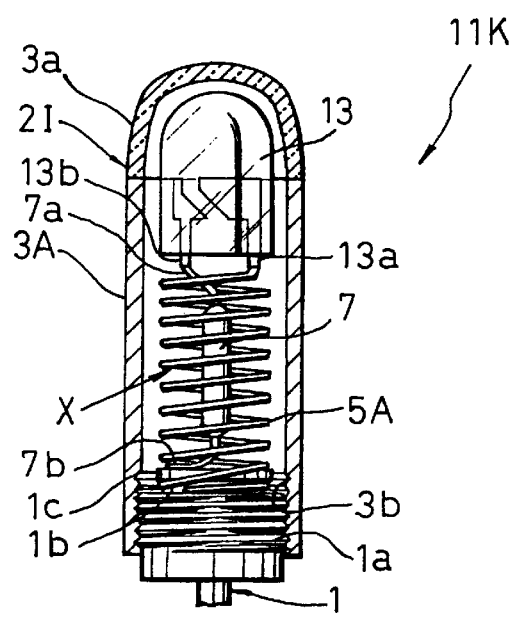
FIG. 29 is an expanded sectional view showing a twelfth embodiment of the present invention.
Figure 30:
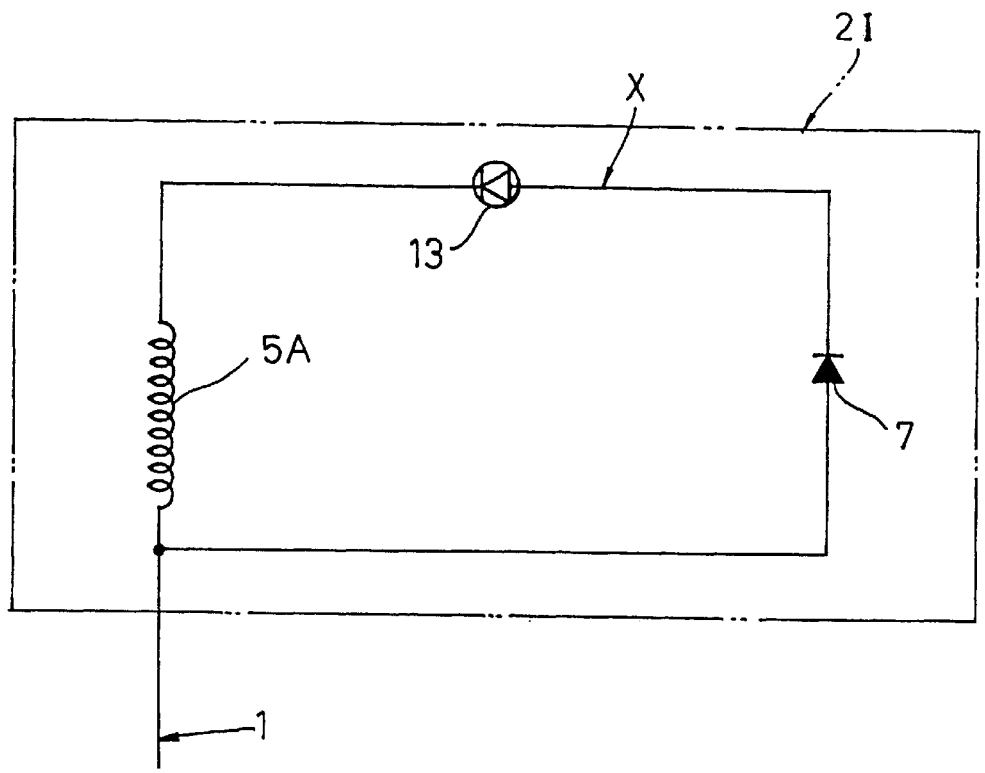
FIG. 30 is a schematic circuit diagram showing a twelfth embodiment of the present invention.
Figure 31:
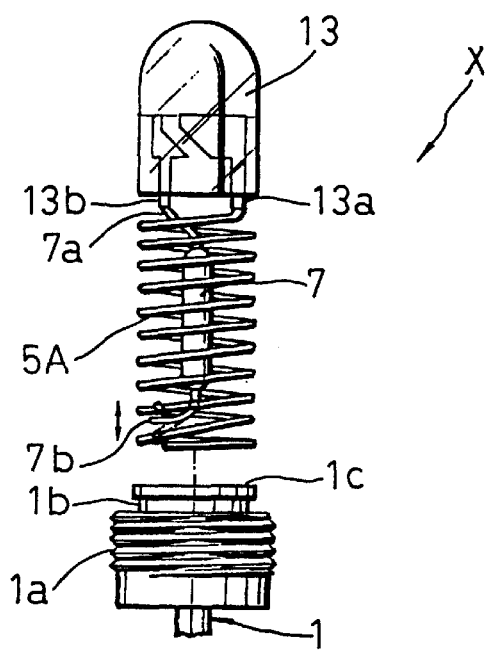
FIG. 31 is a mainly explanation view showing a twelfth embodiment of the present invention.

FIGS. 22 and 23 illustrate a tenth embodiment of the present invention which is distinguished from the first embodiment by the fact that a wave detector 2G includes a piezoelectric buzzer 17 that is mounted as to be sounded from a porous part 18 formed at a case body 3B, instead of the DC indicator of the wave detecting circuit X. A device for detecting electromagnetic waves 11I formed in this way according to the tenth embodiment will provide the same effects as the first embodiment.

FIGS. 24 to 27 illustrate an eleventh embodiment of the present invention which is distinguished from the fifth embodiment by the fact that a wave detector 2H has such a structure that one end of a coil 5A is soldered directly at one of a terminal 13a of the light emitting diode 13, the other terminal 13b of the light emitting diode 13 is soldered directly at one of a terminal 7a of the rectifier diode 7, and the other terminal 7b of the rectifier diode 7 is soldered nearly at the other end portion of the coil 5A, so as to prevent to damage the connection between the light emitting diode 13 and the rectifier diode 7 by the elasticity of the coil 5A. A device for detecting electromagnetic waves 11J formed in this way according to the eleventh embodiment will provide the same effects as the fifth embodiment, it can be prevented efficiently the troubles including broken wire during use.

In addition, the other end of the coil 5A is fixedly inserted into a coil support 1c, the coil support 1c having a coil ditch support 1b at outer circumferential thereof, furthermore, a screw head 1a formed at a top end of the conductor 1 screwed with a groove 3b at a lower end allowance of the case body 3A.

FIGS. 28 to 31 illustrate a twelfth embodiment of the present invention which is distinguished from the eleventh embodiment by the fact that the other terminal 7b of the rectifier diode 7 is bent in an arc-shaped as to have an elasticity of coil 5A, the top end portion of the terminal 7b is soldered at the coil support 1c. A device for detecting electromagnetic waves 11K formed in this way according to the twelfth embodiment will provide the same effects as the eleventh embodiment.

Figure 32:
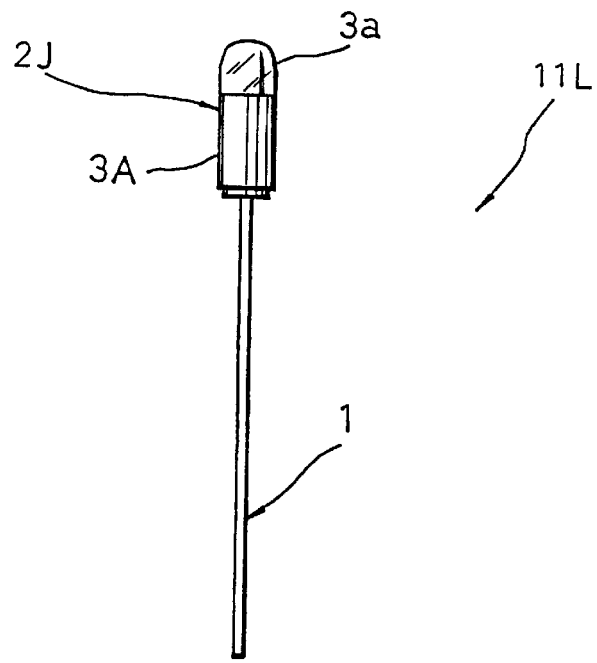
FIG. 32 is a front view showing a thirteenth embodiment of the present invention.
Figure 33:
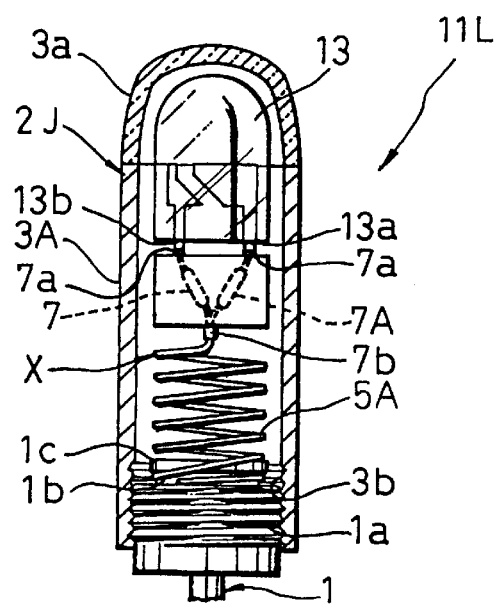
FIG. 33 is a mainly expanded sectional view showing a thirteenth embodiment of the present invention.
Figure 34:
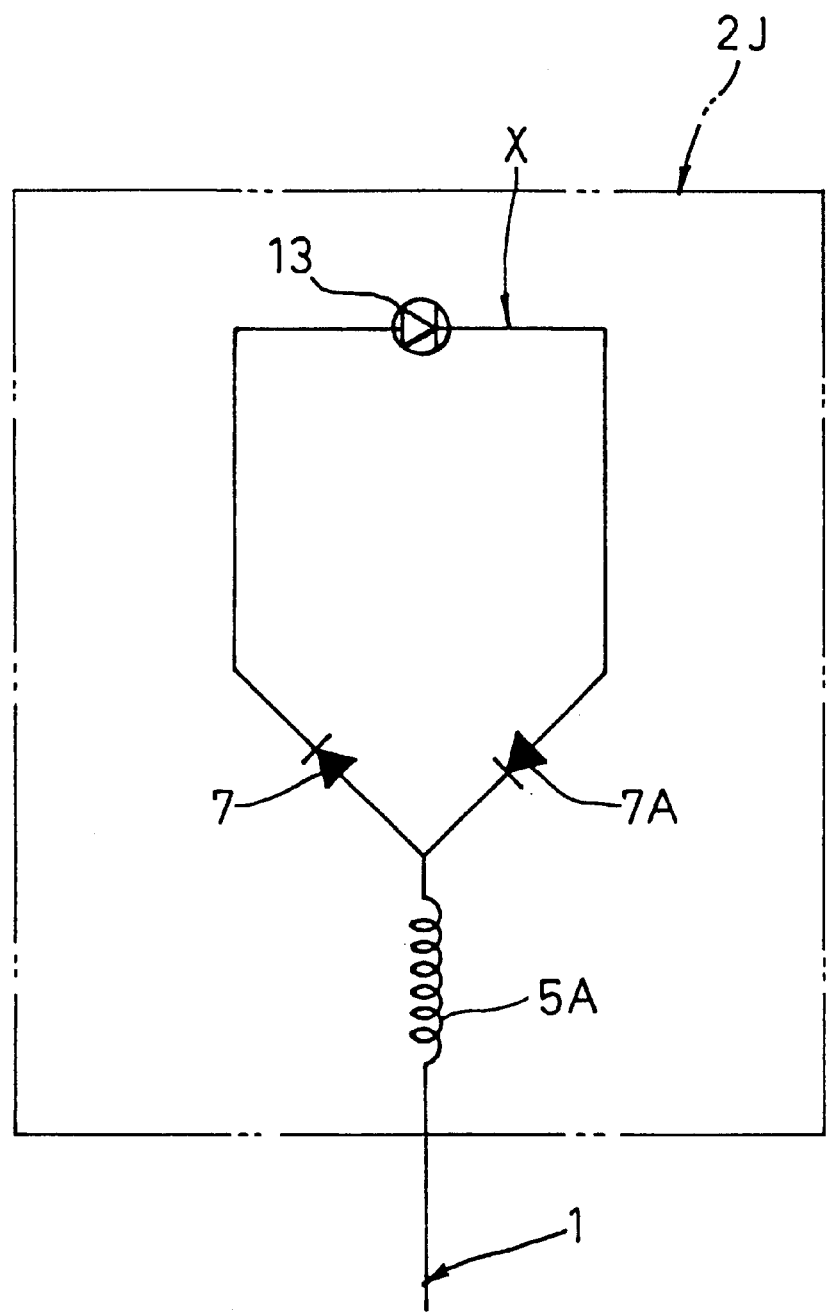
FIG. 34 is a schematic circuit diagram showing a thirteenth embodiment of the present invention.
Figure 35:
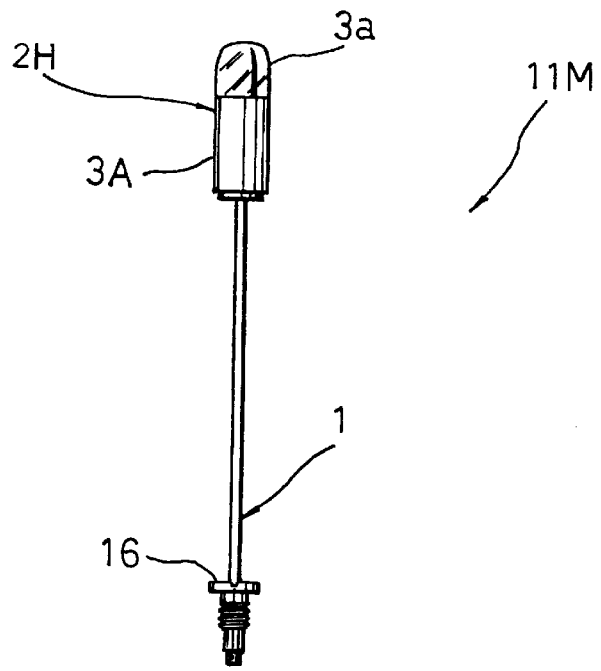
FIG. 35 is a front view showing a fourteenth embodiment of the present invention.
Figure 36:
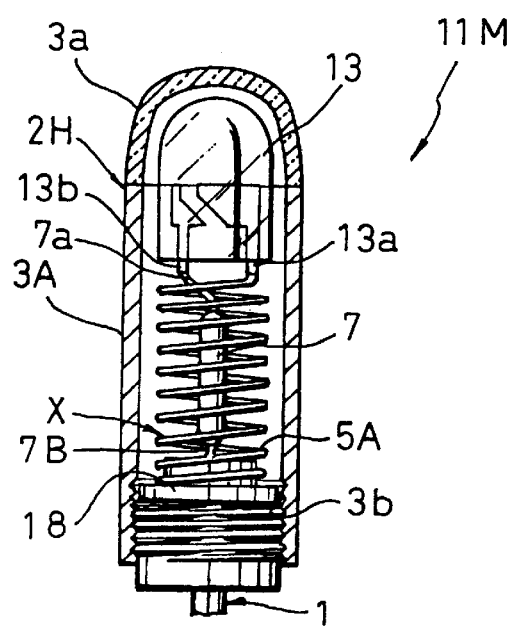
FIG. 36 is a mainly cross-sectional view showing a fourteenth embodiment of the present invention.
Figure 37:
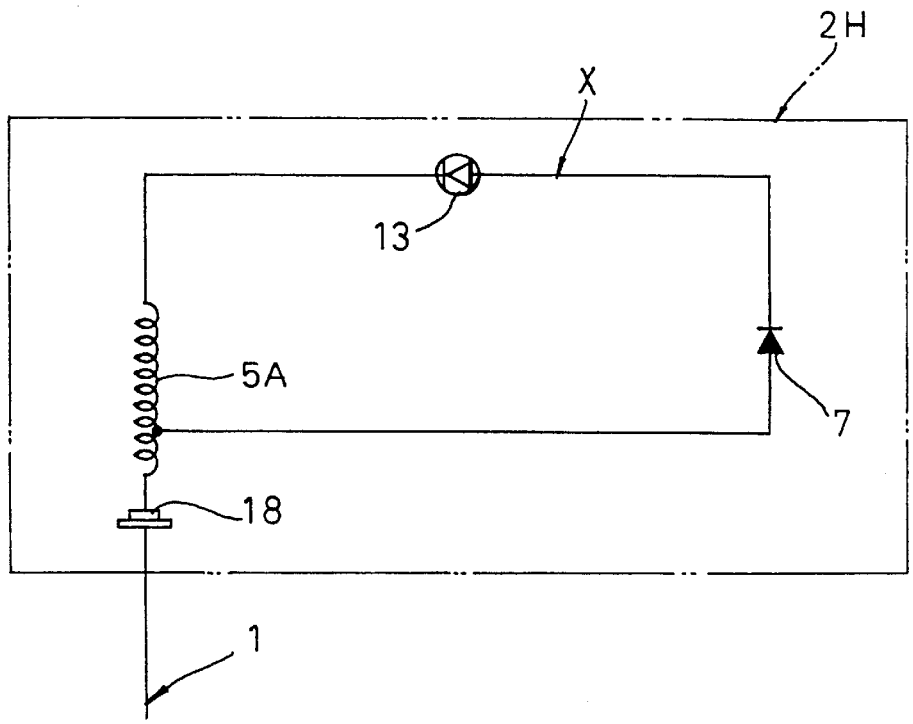
FIG. 37 is a schematic circuit diagram showing a fourteenth embodiment of the present invention.
Figure 38:
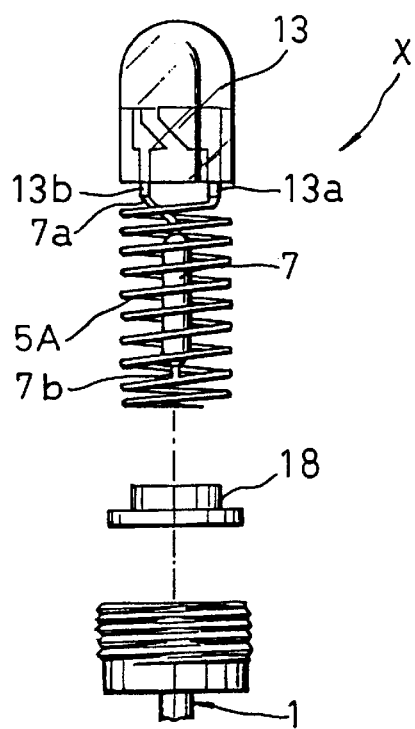
FIG. 38 is a mainly exploded explanation view showing a fourteenth embodiment of the present invention.

FIGS. 32 to 34 illustrate a thirteenth embodiment of the present invention which is distinguished from the eleventh embodiment by the fact that a wave detector 2J has a pair of rectifier diodes 7, 7A is connected alternatively in the opposite direction at top end of the coil 5A, one end of coupled terminal 7b being soldered directly, the other terminals 7a, 7a thereof being soldered at terminals 13a, 13b of the light emitting diode 13. A device for detecting electromagnetic waves 11L formed in this way according to the thirteenth embodiment will provide the same effects as to the eleventh embodiment.

FIGS. 35 to 38 illustrate an fourteenth embodiment of the present invention which is distinguished from the eleventh embodiment by the fact that a conductor 1 has an attachment 16 at a rear end thereof, the attachment 16 providing to an antenna attachment of the portable telephone, in addition, a capacitive resister 18 is interposed between the conductor 1 and the coil 5A. A device for detecting electromagnetic waves 11M formed in this way according to the fourteenth embodiment can be used as the antenna for the portable telephone.

ADVANTAGES OF THE INVENTION

As set forth above, the advantages of the present invention are as follows:

(1) A device for detecting electromagnetic waves according to the present invention comprises: a conductor; a LC-resonance circuit connected with a top end portion of the conductor, the LC-resonance circuit to be allowed a desirable frequency to tune; and a detection circuit further comprising: a rectifier diode which is connected to both ends of said LC-resonance circuit and converts from high-frequency alternating current drove in the LC-resonance circuit to direct current; and indicating means including an indication meter, a lighting, a flashing, or a buzzer connected in series with the rectifier diode, the indicating means corresponding to the strength of DC-electric current so that when electromagnetic waves is detected, high frequency drives in LC-resonance circuit is converted direct current by the rectifier diode, the strength of direct current from the rectifier diode allows the indicating section of the DC indicator to work or the light emitting diode to light, then, the user can understand the wave detecting condition, the user can locate the origine of a sending place.

(2) As apparent from the description of the paragraph (1), it is possible to manufacture it easily and at lower cost relatively because the structure is simple.

(3) As apparent from the description of the paragraph (1), everybody can detect easily an electromagnetic waves such as wave which would be harm to human body because it is possible to detect electromagnetic waves when the top end of the conductor is driven to the direction of sending place of electromagnetic waves.

What is claimed is:

1. A hand held detection device for detecting electromagnetic waves at at least one predetermined frequency, comprising:

an elongated conductor antenna having a free bottom end portion for grasping by a hand of a user and a top end portion, said elongated conductor antenna being configured to function as an antenna at said at least one predetermined frequency;

a casing mounted on said top end portion of said elongated conductor antenna, said casing housing:

a an inductor supported on and electrically connected to said top end portion of said elongated conductor antenna; and a wave detection circuit connected to said inductor, said wave detection circuit including:

a rectifier diode for rectifying high-frequency alternating current received in said inductor via said elongated conductor antenna to produce a direct current; and an indicating means for indicating a presence of a direct current produced by said rectifier diode, said indicating means and said rectifier diode being serially connected to form a series circuit, said series circuit being connected across a portion of said inductor.

2. The hand held detection device according to claim 1, wherein said indicating means is a light emitting diode which lights corresponding to a strength of said direct current produced by said rectifier diode.

3. The hand held detection device according to claim 1, wherein said elongated conductor antenna is a rod.

4. The hand held detection device according to claim 1, further comprising a capacitive resistor electrically connecting said inductor to said top end portion of said elongated conductor antenna.

5. The hand held detection device according to claim 1, in combination with a wireless phone wherein said wireless phone has an antenna input and said elongated conductor antenna has said bottom end portion connected to said antenna input of said portable telephone to provide a signal thereto.

6. The hand held detection device according to claim 1, wherein said wave detection circuit include is connected across a portion of said inductor and a remaining portion of said inductor elastically supports said wave detection circuit on said top end portion of said elongated conductor antenna within said casing.

7. The hand held detection device according to claim 6, wherein said indicating means is a light emitting diode which lights corresponding to a strength of said direct current produced by said rectifier diode.

8. The hand held detection device according to claim 6, wherein said elongated conductor antenna is a rod.

9. The hand held detection device according to claim 6, further comprising a capacitive resistor electrically connecting said inductor to said top end portion of said elongated conductor antenna.

10. The hand held detection device according to claim 6, in combination with a wireless phone wherein said wireless phone has an antenna input and said elongated conductor antenna has said bottom end portion connected to said antenna input of said portable telephone to provide a signal thereto.

11. A method for detecting electromagnetic waves at at least one predetermined frequency, comprising the steps of:

providing an elongated conductor antenna having a free bottom end portion for grasping by a hand of a user and a top end portion, said elongated conductor antenna being configured to function as an antenna at said at least one predetermined frequency;

supporting on and electrically connecting to said top end portion of said elongated conductor antenna a coil;

connecting a wave detection circuit to said coil supported at said top end portion of said elongated conductor antenna, said wave detection circuit including:

a rectifier diode for rectifying high-frequency alternating current received in said coil via said elongated conductor antenna to produce a direct current; and an indicating means for indicating a presence of a direct current produced by said rectifier diode, said indicating means and said rectifier diode being serially connected to form a series circuit, said series circuit being connected across a portion of said coil such that said coil provides elastic support for said series circuit;

housing said coil and said wave detection circuit in a casing mounted on said top end portion of said elongated conductor antenna; and grasping by hand said free bottom end portion of said elongated conductor antenna and directionally orienting said elongated conductor antenna in an electromagnetic field such that said indicating means indicates current is produced by said rectifier diode thus signifying presence of an electromagnetic field.

12. The method according to claim 11, wherein said coil is directly connected to said rectifier diode so as to provide elastic support for said rectifier diode.

13. The method according to claim 11, wherein said indicating means is a light emitting diode which lights corresponding to a strength of said direct current produced by said rectifier diode.

14. The method according to claim 11, wherein said elongated conductor antenna is a rod.

15. The method according to claim 11, further comprising the steps of providing a wireless phone having an antenna input and connecting said bottom end portion of said elongated conductor antenna to said antenna input of said portable telephone to provide a signal thereto.

16. The method according to claim 11, wherein said electrically connecting said inductor to said top end portion of said elongated conductor antenna is effected using a capacitive resistor.

17. The method according to claim 11, wherein said wave detection circuit is connected across said portion of said inductor and a remaining portion of said inductor elastically supports said wave detection circuit on said top end portion of said elongated conductor antenna within said casing.

18. The method according to claim 17, wherein said indicating means is a light emitting diode which lights corresponding to a strength of said direct current produced by said rectifier diode.

19. The method according to claim 17, further comprising the steps of providing a wireless phone having an antenna input and connecting said bottom end portion of said elongated conductor antenna to said antenna input of said portable telephone to provide a signal thereto.

20. The method according to claim 17, wherein said electrically connecting said inductor to said top end portion of said elongated conductor antenna is effected using a capacitive resistor.

* * * * *